| United States Patent [19] | [11] Patent Number: 4,761,363 |
| Hung et al. | [45] Date of Patent: * Aug. 2, 1988 |

[54] UV CURABLE COMPOSITIONS FOR MAKING IMPROVED SOLDER MASK COATINGS

[75] Inventors: Paul L. K. Hung, Edison; Kenneth K. S. Tseng, Piscataway, both of N.J.

[73] Assignee: M&T Chemicals Inc., Woodbridge, N.J.

[*] Notice: The portion of the term of this patent subsequent to Jan. 5, 2005 has been disclaimed.

[21] Appl. No.: 853,482

[22] Filed: Apr. 18, 1986

Related U.S. Application Data

[62] Division of Ser. No. 747,090, Jun. 20, 1985.

[51] Int. Cl.$^4$ .............................................. G03C 1/70
[52] U.S. Cl. .................................. 430/284; 430/286; 430/287; 522/93; 522/96; 522/97; 522/98
[58] Field of Search ................... 430/284, 288, 286; 522/93, 96, 97, 98

[56] References Cited

U.S. PATENT DOCUMENTS 4,228,232 10/1980 Rousseau ........................ 430/284 X
4,442,198 4/1984 Tsao et al. ...................... 430/284 X

*Primary Examiner*—Paul R. Michl
*Assistant Examiner*—Cynthia Hamilton
*Attorney, Agent, or Firm*—S. A. Marcus; S. H. Parker; R. E. Bright

[57] ABSTRACT

A composition including a mixture of UV curable urethane acrylate and a urethane diacrylate compounds provides an aqueous alkaline developable, flexible solder mask having excellent electrical insulation resistance under hydrolytic testing conditions at elevated temperatures.

10 Claims, No Drawings

UV CURABLE COMPOSITIONS FOR MAKING IMPROVED SOLDER MASK COATINGS

This is a divisional of co-pending application Ser. No. 747,090 filed on June 20, 1985.

BACKGROUND OF THE INVENTION

1. Field of the Invention

This invention relates to solder mask coatings having improved performance characteristics, and, more particularly it is concerned with aqueous alkaline developable, UV curable composition for making flexible solder mask coatings having excellent electrical insulation resistance under extreme testing conditions.

2. Description of the Prior Art

A number of U.S. patents disclose photopolymerizable prepolymers and compositions for use as solder masks in printed circuit boards, including U.S. Pat. Nos. 3,660,088; 3,753,720; 3,883,352: 3,887,450; 4,199,163; 4,361,640; 4,436,806: 4,458,007; 4,506,004; and 4,508,916. However, none of these UV curable compounds and compositions are entirely satisfactory for use as a commercial solder mask.

A feature of a preferred solder mask coating is an ability to be developed with an aqueous, slightly alkaline solution, thereby avoiding the use of organic solvents in the developing step. The desired solder mask coatings also should exhibit flexibility, heat and chemical resistance, surface hardness, abrasion resistance, adhesion to the underlying metal of the printed circuit board, and a high cure depth at low dosages. Particularly sought after are solder mask which exhibit excellent electrical insulation resistance and a rapid curing rate. These stringent requirements imply that the structure of the UV curable compound and its compositions must be carefully designed in order that the solder mask can achieve commercial acceptability.

For example, in Rendulic, U.S. Pat. No. 4,436,806, there is described a method and apparatus for making a printed circuit board by imaging a liquid polymer which has been coated onto the board by roller coating. In this process, imaging is carried out while the polymer is wet, the photo tool being positioned in a close relationship with the coated board. The liquid polymer compositions disclosed by Rendulic for use in this process are urethane acrylates having a polyether or polyester extending chain unit. These compositions have a very low viscosity which is desirable for forming coatings with a roller coater. However, these compositions have a relatively low degree of ethylenic unsaturation per weight unit so that they require a relatively high energy level for curing.

In contrast to the imaging technique of the above-mentioned patent, Sullivan, in U.S. Pat. No. 4,506,004, describes a contact method of imaging a liquid solder mask coating on a printed circuit board. In this method, the UV curable solder mask coating is screen printed to a given thickness, prehardened and imaged by exposure with suitable UV energy. The desired characteristics of good electrical performance and excellent printing resolution are the attributes of the Sullivan system. The requirements of a suitable photopolymerizable compound for use in this process include an ability to form a smooth, flexible coating which can impart chemical and heat resistance to the solder mask. Furthermore, the coating must exhibit excellent adhesion to the board, an ability to be cured to a desired depth with a minimum of UV energy, and excellent electrical insulation resistance.

Accordingly, it is an object of this invention to provide a UV curable composition for making a solder mask having advantageous performance characteristics.

Another object of this invention is to provide a UV curable composition, which includes a mixture of UV curable compounds, for use as a solder mask, and, particrlarly, a composition which can be developed rapidly in an aqueous, slightly alkaline solution.

A particular object herein is to provide a flexible solder mask coating which exhibits an electrical insulation resistance of greater than $10^7$ ohm-cm after 7 days exposure, at 50° C. and 90% relative humidity.

Still another object herein is to provide a solder mask coating which can be rapidly cured, preferably at an energy level of less than 4.5 joules per sq. cm., to provide a cure depth of at least 18 mils at this energy level.

Another object of this invention is to provide a UV curable composition which can be coated, suitable by screen printing techniques, to form a smooth, uniform, glossy, flexible, coating up to 3 mil thickness.

Yet another object of the invention is to provide a solder mask composition which is stable without gelation for at least six months.

A further object herein is to provide a flexible solder mask coating having substantially 100% adhesion to the underlying metal of the printed circuit board, particularly on copper and tin-lead.

Another object herein is to provide a solder mask product which exhibits good surface hardness, abrasion, heat and organic solvent resistance.

A specific object herein is to provide a solder mask composition which is particularly adapted for use in the method and apparatus of making printed circuit boards described in U.S. Pat. No. 4,506,004.

Another specific object herein is to provide a mixture of UV curable acrylate compounds which will meet all of the aforesaid objects in an advantageous manner.

These and other objects and features of the invention will be made apparent from the following description of the invention.

SUMMARY OF THE INVENTION

This invention provides a UV curable composition for making a solder mask having advantageous performance characteristics. The composition of the invention includes a mixture of UV curable compounds, defined hereinafter, from which aqueous, alkaline developable, flexible solder mask coatings can be made, having excellent electrical insulation resistance. The coatings also are smooth, uniform and glossy up to 3 mil thickness, exhibit substantially 100% adhesion to the underlying metal of the printed circuit board, exhibit good surface hardness, and abrasion, heat and organic solvent resistance.

The composition mixture comprises (a) 40–70% by weight of UV curable compounds which includes 20–99% by weight, preferably 30–70% by weight, and, optionally, about 50% by weight of a urethane acrylate, described in detail in co-pending application Ser. No. 735,411 filed May 17, 1985, by the same named inventors as herein, and assigned to the same assignee as herein, and 1–80% by weight, preferably 30–70% by weight, and optionally, about 50% by weight, of a urethane diacrylate;

(b) 20–50% by weight of one or more reactive diluent monomers, and (c) 0.5–10% by weight of a photoinitiator.

The composition of the invention also may include about 1–5% by weight of one or more of the following: a crosslinking agent, a pigment or dye, a rheology modifier, and a thermal stabilizer; and 1–15% by weight of a filler.

The urethane acrylate compound is obtained by reacting (i) at least one diisocyanate compound selected from the group consisting of aliphatic and cycloaliphatic diisocyanates, e.g. dicyclohexylmethylene diisocyanate, isophorone, diioscyanate, and hexamethylene diisocyanate, (ii) one mole of a hydroxyalkyl acrylate; e.g. hydroxypropyl acrylate, (iii) a polyol having at least 3 hydroxyl groups, e.g. glycerol; and (iv) at least one mole of a dicarboxylic acid anhydride, saturated or unsaturated, e.g. maleic anhydride.

The urethane acrylate compound is characterized by (a) terminal ethylenic unsaturation; (b) at least one terminal carboxylic acid group; and (c) alkylene connecting groups intermediate said terminal groups, one of which preferably is substituted with at least one hydroxy group.

The urethane diacrylate compound of the composition of the invention is obtained by reacting (i) at least one diioscyanate compound selected from the group consisting of aliphatic, cycloaliphatic and diisocyanates, e.g. dicyclohexyl methylene diisocyanate, isophorone diisocyanate, hexamethylene diisocyanate and toluene diisocyanate, with (ii) two moles of a hydroxyalkyl acrylate, e.g. hydroxypropyl acrylate.

The urethane acrylate component of the mixture of UV curable compounds provides the flexibility characteristics, aqueous alkaline developability, adhesion, surface hardness, and high cure depth at a low energy level; while the urethane diacrylate provides enhanced electrical insulation resistance.

DETAILED DESCRIPTION OF THE INVENTION

The UV curable, urethane acrylate compound can be obtained by a three- step, two-part reaction sequence, the first step of which involves reacting a suitable diisocyanate compound with one mole of a hydroxyalkyl acrylate to form the corresponding isocyanate-capped acrylate. Suitable diisocyanates for use in this step include aliphatic and cycloaliphatic diisocyanates, e.g. dicyclohexylmethylene diisocyanate, isophorone diisocyanate, hexamethylene diisocyanates, and trimethylhexamethylene diisocyanate. Aromatic diisocyanates are not preferred for making the urethane acrylate compound because they form non-flexible coatings.

The hydroxyalkyl acrylate reactant may be selected from such compounds as hydroxymethyl acrylate, hydroxyethyl acrylate, hydroxypropyl acrylate, hydroxybutyl acrylate and the like, although other acrylates known in the art may be used as well. For purposes of this invention the term "acrylate" includes the corresponding "methacrylate" derivatives.

The second step in the reaction sequence is esterification of a suitable polyol reactant with a dicarboxylic acid anhydride to form an ester of the dicarboxylic acid. Suitable polyols have at least three, and up to six, hydroxyl groups in the molecule, and include such compounds as glycerol, trimethylolpropane, 1,2,6-hexanetriol, caprolactone polyol, and sugars, such as fructose. Glycerol is preferred.

To improve heat resistance of the solder mask, part of the polyol, e.g. about 20% mole thereof, may include a suitable sulfur-containing diol, e.g. dihydroxydiphenylsulfone or the corresponding sulfide.

Suitable dicarboxylic acid anhydrides for this step include such acid anhydrides as maleic anhydride, succinic anhydride, glutaric anhydride, adipic anhydride, phthalic anhydride and the like. Maleic anhydride is preferred.

In carrying out this reaction, for example, with a triol, one mole of the acid anhydride is used, thus forming the monoester intermediate, while leaving two hydroxyl groups available for subsequent reaction. One hydroxyl group then will be substituted on the alkylene group in the final product. The corresponding diesters also may be prepared by using two moles of the acid anhydride, in which case two terminal carboxylic acid groups will be present in the final compound.

The third and final step in the process is the condensation of the isocyanate-capped acrylate with the ester of the dicarboxylic acid anhydride. The final reaction product is characterized by terminal ethylenic unsaturation at one end, and at least one terminal carboxylic acid group at the other end, with the organic diisocyanate moiety attached to the unsaturated group, and a alkylene group adjacent said terminal acid group. Preferably, a hydroxyl group is present as a substituent on the alkylene group. Two terminal carboxylic acid groups also may be included in the final compound.

The desired urethane acrylate may be prepared by a three-step, one-pot synthesis wherein the four reactants are added sequentially in the same reaction vessel. In this method, the diisocyanate is charged and the hydroxyalkyl acrylate is added slowly. After an initial reaction between these reactants, the polyol is added, followed by the dicarboxylic acid anhydride.

The 3-step, two-part reaction sequence is given below.

METHOD OF PREPARING URETHANE ACRYLATE COMPOUND OF INVENTION

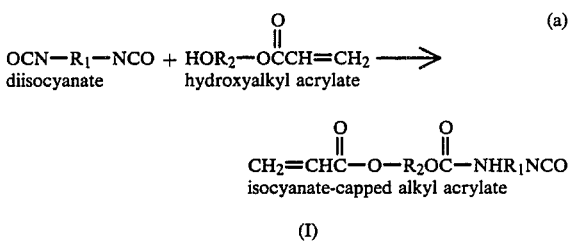

(I)

wherein
$R_1$ is aliphatic or cycloaliphatic, and
$R_2$ is alkylene;

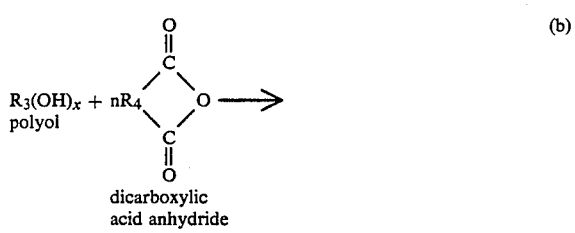

-continued

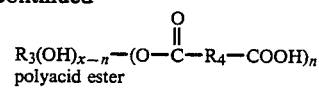
polyacid ester
(II)

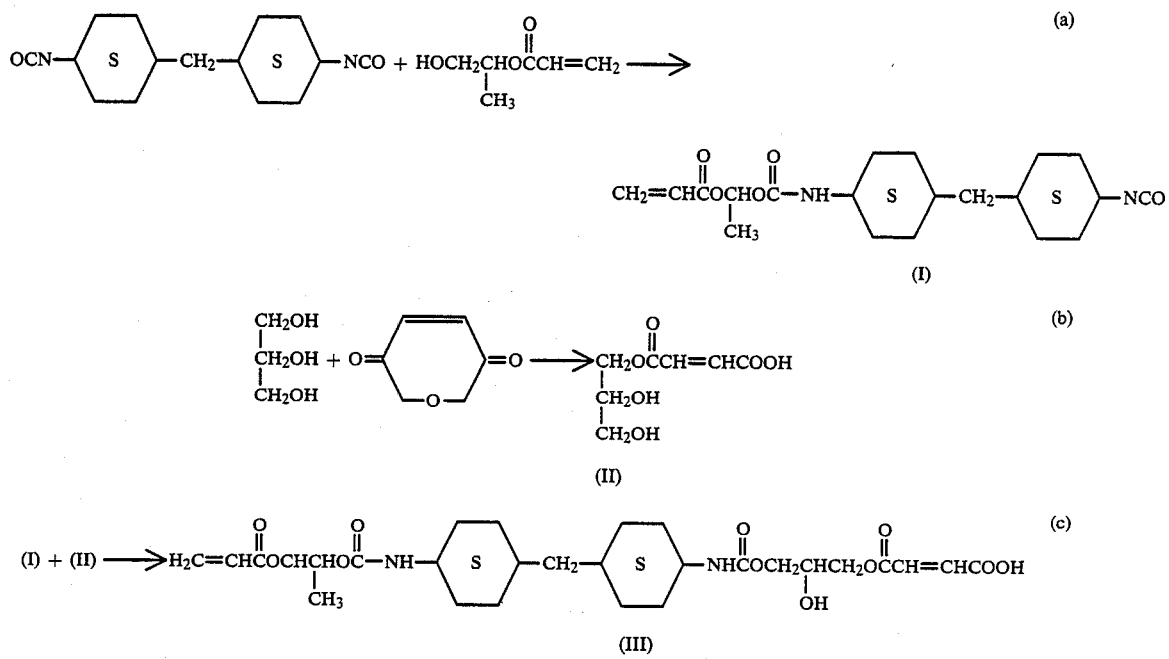

where
x is 3–6,
n is 1–5,
(x−n) is a positive integer,
$R_3$ is alkylene, and
$R_4$ is aliphatic or cycloaliphatic, saturated or unsaturated, or aromatic;

(I) + (II) ⟶ (c)

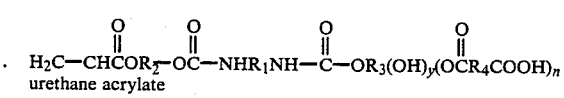
urethane acrylate
(III)

where
y is 0–4, provided, however, that if y is 0, then n is at least 2.

As an illustration of this synthesis, the reaction of dicyclohexylmethylene diisocyanate, one mole of hydroxypropyl acrylate, glycerol and one mole of maleic anhydride proceeds as follows:

(a)

(b)

(c)

With 2 moles of maleic anhydride, the reaction sequence proceeds as follows:

(IV)

(c)

The UV curable, urethane diacrylate component is prepared by reacting a suitable diisocyanate with 2 moles of a hydroxyalkyl acrylate to form the corresponding isocyanate diacrylate. Suitable diisocyanates include aliphatic, cycloaliphatic and aromatic diisocyanates, e.g. dicyclohexylmethylene diisocyanate, isophorone diisocyanate, hexamethylene diisocyanates, trimethylhexamethylene diisocyanate and toluene diisocyanate. The hydroxyalkyl acrylate reactant may be selected from such compounds as hydroxymethyl acrylate hydroxyethyl acrylate, hydroxypropyl, acrylate, hydroxybutyl acrylate, and the like, although others known in the art may be used as well.

The UV curable, aqueous alkaline developable composition for forming a soldering mask comprises:

(a) 40–70% by weight of a mixture of 20–99% by weight of said urethane acrylate compound and 1–80% by weight of said urethane diacrylate:

(b) 20–50% of a reactive monomer diluent, and
(c) 0.5–10% of a photoinitiator.

The reactive diluent monomers are included in the composition of the invention to reduce its viscosity and further increase its curing rate. Suitable reactive diluent monomers for use therein include ethylenically unsaturated monomers that are compatible and copolymerizable with the substituted urethane acrylate and urethane diacrylates of the invention. Such ethylenically unsaturated monomers include mono-, di- and tri-acrylates as, for example, hydroxyalkyl acrylates, such as e.g. hydroxyethyl acrylate; and acrylate esters, e.g. methyl methacrylate, ethyl acrylate, 2-ethylhexyl acrylate, cyclohexyl acrylate, isobutoxymethyl methacrylate, t-butyl acrylate, methyl acrylate, butyl acrylate, 2-(N-ethylcarbamyl)ethyl methacrylate; aryloxyalkyl acrylates, e.g. phenoxyethyl acrylate: bis-phenol-A diacrylate, ethylene glycol diacrylate, polyethylene glycol diacrylate, glycerol diacrylate and methacrylate, bisphenol A diacrylate, tetrapropylene glycol diacrylate, and the like. Suitable triacrylates include glycerol triacrylate, ethoxylated trimethylol triacrylate, and the like.

Other reactive compounds can be included in the composition of the invention to increase the cross-linking density of the coating. Such reactive compounds include, but are not limited to, pentaerythritol 3-mercaptopropionate, 1,4-butylene dimethacrylate or acrylate, 1,1,6,6-tetrahydroperfluorohexanediol diacrylate, ethylene dimethacrylate, glycerol diacrylate or methacrylate, glycerol trimethacrylate, diallyl phthalate and 1,3,5-tri(2-methacryloxyethyl)-s-triazine.

The UV curable composition of this invention also contains a photoinitiator which generates free radicals owing to actinic light. Suitable examples of such photoinitiators include substituted and unsubstituted polynuclear quinones, such as 2-ethylanthraquinone, 2-t-butylanthraquinone, octamethylanthraquinone, 1,2-benzanthraquinone, 2,3-diphenylanthraquinone, thioxanthone, e.g. chloro and isopropyl derivates, and the like; ketoaldonyl compounds such, as diacetyl, benzyl and the like; α-ketoaldonyl alcohols and ethers, such as benzoin, pivalone, and the like; α-hydrocarbon-substituted aromatic acyloins such as α-phenylbenzoin, α,α-diethoxyacetophenone, and the like; and aromatic ketones such as benzophenone, 4,4'-bisdialkylaminobenzophenone, and the like. These photoinitiators may be used alone or as a combination of two or more of them. Examples of combinations include 2,4,5-triarylimidazole dimer and Z-mercaptobenzoquinazole, leucocrystal violet, tris(4-diethylamino-2-methylphenyl)methane, or the like, and compounds which may not have photoinitiating properties alone but which nevertheless can constitute a good photoinitiating system, in combination with the above-mentioned materials. Such compounds include, for example, tertiary amines, such as triethanolamine and the like, which are used in combination with benzophenone. These photoinitiators and/or photoinitiator systems preferably are present in an amount of about 0.5 to 10% by weight of the composition.

EXAMPLE 1

3-Step, One-Pot Synthesis of Urethane Acrylate (1)
Desmondur W/HPA/Glycerol/Maleic Anhydride (1)

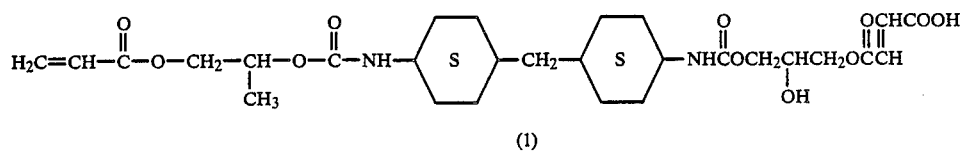

(1)

|  |  | Parts | Equivalents |
|---|---|---|---|
| A. | 4,4'-dicyclohexylmethylene diisocyanate (Desmondur W) | 262 | 2 |
| B. | Dibutyltin dilaurate | 1.7 | 2000 ppm |
| C. | Hydroxylpropyl acrylate (HPA) | 130 | 1 |
| D. | Phenoxyethyl acrylate | 250 | 1.3 |
| E. | Glycerol | 92.1 | 1 |
| F. | Maleic anhydride | 98 | 1 |
| G. | Hydroquinone methyl ether | 1.7 | 2000 ppm |

A resin kettle equipped with a mechanical stirrer, thermometer, drying tube and pressure equalizing dropping funnel was charged with (A), (B) and (D). The mixture then was stirred while (C) was added slowly over 20 min. The temperature was maintained at below 55° C. Upon completion of the addition, the mixture was maintained at 55°–60° C. until the NCO number was 10.7±0.3, as determined by titration. (E) then was added slowly over 30 min. and the temperature was maintained at below 55° C. Heating was continued at 60° C. until IR showed the absence of NCO absorption at 2275 cm$^{-1}$. (F) then was added to the reaction mixture at 70°–75° C. over 20 min., followed by (G). Heating was continued at 75° C. until the maleic anhydride was completely reacted, as indicated by the absence of peaks at 1845 and 1975 cm$^{-1}$.

The product was a viscous liquid having a Brookfield viscosity of 64,000 cps at 25° C., and an acid group contents of 1.48 meq/gm.

EXAMPLE 2

3-Step, One-Pot Synthesis of Urethane Acrylate (2)
Desmondur W/HPA/Glycerol/(Maleic Anhydride)$_2$
(2)

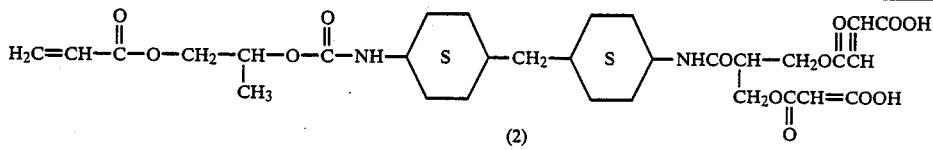

|   | | Parts | Equivalents |
|---|---|---|---|
| A. | 4,4'-dicyclohexylmethylene diisocyanate | 262 | 2 |
| B. | Dibutyltin dilaurate | 1.9 | 2000 ppm |
| C. | Hydroxylpropyl acrylate | 130 | 1 |
| D. | Phenoxyethyl acrylate | 291.5 | 1.52 |
| E. | Glycerol | 92.1 | 1 |
| F. | Maleic anhydride | 196 | 2 |
| G. | Hydroquinone methyl ether | 1.9 | 2000 ppm |

A resin kettle equipped with a mechanical stirrer, thermometer, drying tube and pressure equalizing dropping funnel was charged with (A), (B) and (D). The mixture then was stirred while (C) was added slowly over 20 min. The temperature was maintained at below 55° C. Upon completion of the addition, the mixture was maintained at 55°–60° C. until the NCO number was 10.7±0.3, as determined by titration. (E) then was added slowly over 30 min. and the temperature was maintained at below 55° C. Heating was continued at 60° C. until IR showed the absence of NCO absorption at 2275 cm$^{-1}$. (F) then was added to the reaction mixture at 70°–75° C. over 20 min., followed by (G). Heating was continued at 75° C. until the maleic anhydride was completely reacted, as indicated by the absence of peaks at 845 and 1975 cm$^{-1}$.

The product was a viscous liquid having a Brookfield viscosity of 320,000 cps at 25° C., and an acid group contents of 2.60 meq/gm.

EXAMPLE 3

3-Step, 2-Pot Synthesis of Urethane Acrylate of Ex. 1

|   | | Parts | Equivalents |
|---|---|---|---|
| A. | 4,4'-dicyclohexylmethylene diisocyanate | 262 | 2 |
| B. | Dibutyltin dilaurate | 1.7 | 2000 ppm |
| C. | Hydroxylpropyl acrylate | 130 | 1 |
| D. | Phenoxyethyl acrylate | 168 | |
| E. | Glycerol | 92.1 | |
| F. | Maleic anhydride | 98 | |
| G. | Phenoxyethyl acrylate | 82 | |
| H. | Hydroquinone methyl ether | 1.7 | 2000 ppm |

A resin kettle, equipped with a mechanical stirrer, thermometer, drying tube and pressure equalizing dropping funnel was charged with (A), (B) and (D). The mixture was stirred while (C) was added slowly over 20 min. The temperature was maintained at below 55° C. Upon completion of the addition, the mixture was maintained at 55°–60° C. until the NCO number was 10.7±0.3 as determined by titration. In another resin kettle equipped with a mechanical stirrer, a thermometer and drying tube was charged with (E), (F) and (G). The mixture was heated with stirring at 90° C. until the maleic anhydride was completely reacted, as indicated by the absence of peaks at 1845 and 1975 cm$^{-1}$. This product was then added to the intermediate prepared in the first kettle, described above, over 45 min. at a temperature below 55° C. The reaction temperature was maintained at 60° C. until an infrared spectrum showed the absence of NCO absorption peak at 2275 cm$^{-1}$. (H) then was added and the mixture stirred until (H) completely dissolved. The product was a viscous liquid having a viscosity of 72,000 cps at 25° C., and acid group contents of 1.23 meq/gm.

EXAMPLE 4

Preparation of Urethane Diacrylate

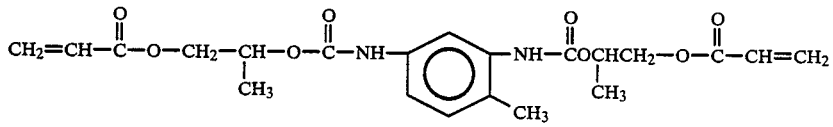

Toluene diisocyante (1 mole) and hydroxypropyl acrylate (2 moles) are reacted at 550° C. for 6 hrs. to give the product, which was a viscous liquid having a Brookfield viscosity of 100,000 cps at 25° C.

EXAMPLE 5

The following composition was prepared using a UV curable mixture of equal weight quantities of the urethane acrylate of Example 1, and the urethane diacrylate of Example 4. The composition was used in forming a solder mask composition for a printed circuit board.

| COMPOSITION | |
|---|---|
| Component | Parts by Wt. |
| Urethane acrylate of Ex. 1 | 30.0 |
| Urethane diacrylate of Ex. 4 | 30.0 |
| Tone-100 (Union Carbide) reactive diluent monomer | 25.5 |
| Pentaerythritol 3-mercaptopropionate-cross-linker | 3.0 |
| CAB-O-SIL thixotropic agent | 4 |
| Cymel 301 (Am. Cyan.) - cross-linker | 5 |
| IRG 651 (Ciba-Geigy) photoinitiator | 2 |
| CNF 853 - green pigment | 1 |
| Colloid 640 (Colloid Chem.) leveling agent | 0.8 |

| COMPOSITION | |
|---|---|
| Component | Parts by Wt. |
| MTBHQ - mono-tert.-butyl hydroquinone-stabilizer | 0.2 |

This composition is thixotropic with a Brookfield viscosity of 208,000 cps at 25° C. at 0.5 rpm. and 39,200 cps at 100 rpm., and is stable without gelation for more than 6 months.

SOLDER MASK

A copper-clad epoxy fiber glass printed circuit board was cleaned by scrubbing to remove corrosion and foreign material and coated by screen printing with the above composition to a thickness of about 3 mils. Then another 3 mil thick coating was applied onto a photo tool in accordance with the method given in U.S. Pat. No. 4,506,004, Example 2. The two coatings then were given a flash curing with about 0.2–0.4 joules per cm² of energy, using a mercury vapor lamp, to effect partial hardening. The two coatings then were mated to form a composite coating of 6 mils thickness, flipped over and given a main exposure with 0.5 joules per cm² for 30 seconds. The unexposed coating then was developed by removing it (negative working) in a 1% sodium carbonate solution (pH 11) at room temperature for 4 min., and finally cured to a depth of 18 mils with 2.5 joules per cm² of UV energy.

The cured solder mask was a smooth, uniform, glossy, and flexible coating having 100% adhesion under a crosshatch tape test both before and after application of solder; resistant to organic solvents for more than 15 minutes in an immersion test; exhibited excellent legend ink adhesion characteristics; excellent heat resistance as measured by a 20-second dip in solder at a temperature of 260° C. without blistering: very good surface hardness and abrasion resistance; excellent adhesion to the printed circuit board, and an electrical insulation resistance of $4 \times 10^7$ ohm-cm. after 7 days at 50° C. and 90% R.H.

EXAMPLE 6

The procedure of Ex. 5 was repeated using the urethane acrylate of Ex. 2, which has dicarboxylic acid terminal groups, to provide another solder mask with advantageous properties.

EXAMPLE 7

The procedures of Exs. 1–6 were repeated using a polyol mixture of 20 mole % of dihydroxydiphenylsulfone and 80 mole % of glycerol as the polyol in the synthesis of the urethane acrylates. The solder masks using this polyol showed improved heat resistance as compared to those using glycerol alone.

While the invention has been described with particular reference to certain embodiments thereof, certain changes and modifications may be made which are within the skill of the art. It is intended to be bound only by the appended claims, in which:

What is claimed is:

1. A UV curable aqueous alkaline developable, urethane acrylate composition comprising:
   (a) 40–70% by weight of a mixture of
      (i) 20–99% by weight of a urethane acrylkate which has the following formula:

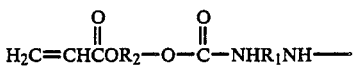
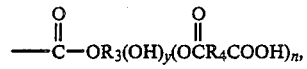

where
   $R_1$ is aliphatic or cycloaliphatic,
   $R_2$ and $R_3$ are alkylene,
   $R_4$ is aliphatic or cycloaliphatic, saturated or unsaturated, y is 0–4 and n is 1–5, provided that if y, is 0, then n is at least 2; and
   (ii) 1–80% by weight of a urethane diacrylate obtained by reacting a urethane with 2 moles of a hydroxy alkyl acrylate;
   (b) 20–50% by weight of a reactive monomer diluent, and
   (c) 0.5–10% by weight of a photoinitiator.

2. A composition according to claim 1 in which y is 1 and n is 1.

3. A composition according to claim 1 in which y is 0 and n is 2.

4. A composition according to claim 1 wherein said urethane diacrylate is made by reacting a diisocyanate selected from the group consisting of aliphatic, cycloaliphatic and aromatic diisocyanates, with 2 moles of a hydroxyalkyl acrylate.

5. A composition according to claim 4 wherein said diisocyanate is an aliphatic diisocyanate.

6. A composition according to claim 4 wherein said diisocyanate is a cycloaliphatic diisocyanate.

7. A composition according to claim 4 wherein said diisocyanate is an aromatic diisocyanate.

8. A composition according to claim 4 wherein said diisocyanate is toluene diisocyanate.

9. A composition according to claim 4 wherein said urethane diacrylate has the formula:

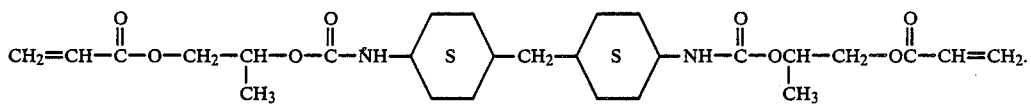

10. A UV curvable, aqeuous alkaline developable composition according to claim 1 wherein said urethane acrylate compound has the formula:

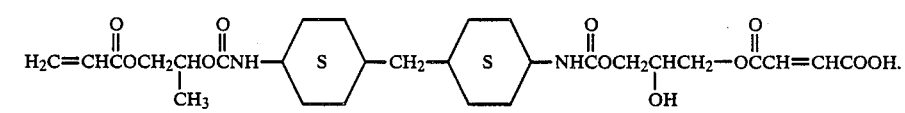

\* \* \* \* \*